(12) United States Patent
Fang

(10) Patent No.: US 9,696,744 B1
(45) Date of Patent: Jul. 4, 2017

(54) CMOS LOW VOLTAGE BANDGAP REFERENCE DESIGN WITH ORTHOGONAL OUTPUT VOLTAGE TRIMMING

(71) Applicant: Kilopass Technology, Inc., San Jose, CA (US)

(72) Inventor: Wen Fang, San Jose, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/281,054

(22) Filed: Sep. 29, 2016

(51) Int. Cl.
*G05F 3/16* (2006.01)
*G05F 3/02* (2006.01)
*H03K 5/08* (2006.01)

(52) U.S. Cl.
CPC ........... *G05F 3/02* (2013.01); *H03K 5/08* (2013.01)

(58) Field of Classification Search
CPC ............... G05F 3/02; G05F 3/16; G05F 3/245
See application file for complete search history.

(56) References Cited

U.S. PATENT DOCUMENTS

| | | |
|---|---|---|
| 6,836,160 B2 | 12/2004 | Li |
| 8,093,880 B2 | 1/2012 | Boas et al. |
| 8,102,201 B2 | 1/2012 | Marinca |
| 8,531,235 B1 | 9/2013 | Zonte |
| 8,648,648 B2 | 2/2014 | Choi |
| 8,786,355 B2 * | 7/2014 | Hao ........................ G05F 3/242 323/313 |
| 9,122,290 B2 | 9/2015 | Eberlein |
| 9,141,124 B1 | 9/2015 | Nien |
| 9,158,320 B1 | 10/2015 | Shrivastava |
| 9,354,644 B2 * | 5/2016 | Sharma ............... H03F 3/45771 |

* cited by examiner

*Primary Examiner* — Jeffrey Zweizig
(74) *Attorney, Agent, or Firm* — Ropes & Gray LLP

(57) ABSTRACT

Bandgap Voltage Reference circuits configured to produce reference voltages with both voltage offset and a voltage temperature slope are disclosed. By generating the voltage offset from a temperature-independent current, the voltage offset of the reference voltage may be temperature-independent, while generating the voltage temperature slope from a temperature-dependent current allows the voltage temperature slope to vary with temperature. To ensure that the voltage offset remains independent from the voltage temperature slope, an apparatus is disclosed for orthogonal trimming of voltage offset and voltage temperature slope.

10 Claims, 2 Drawing Sheets

CMOS LOW VOLTAGE BANDGAP REFERENCE DESIGN WITH ORTHOGONAL OUTPUT VOLTAGE TRIMMING

FIELD OF THE DISCLOSURE

This disclosure relates generally to semiconductor integrated circuits, and more particularly to bandgap voltage reference circuits with programmable temperature slope and programmable voltage offset.

BACKGROUND OF THE DISCLOSURE

Very-large-scale-integration (VLSI) circuits require stable and predictable voltage references over PVT (Process, supply Voltage, and Temperature) variations. Bandgap Voltage Reference (BVR) circuits are used to produce these temperature-independent voltage references. Some One Time Programmable (OTP) non-volatile memory designs require BVR circuits to be powered with core voltage. However, existing BVR circuit designs do not provide necessary accuracy at the typical low core voltage associated with Fin Field Effect Transistors (FinFET) technology used in OTP and other low voltage transistor technology.

SUMMARY OF THE DISCLOSURE

An apparatus is provided for independently adjusting voltage offset and voltage temperature slope of a low power voltage reference circuit. For example, the voltage offset may be produced from a temperature-independent current source that is separately programmable from a second, temperature-dependent current source that produces a voltage temperature slope. The voltage temperature slope may be the combination of Proportional To Absolute Temperature (PTAT) voltage and Complementary To Absolute Temperature (CTAT) voltage devices.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

In bandgap reference design, a precision voltage reference insensitive to process, supply voltage and temperature is obtained by summing a voltage that is proportional to absolute temperature (PTAT) and a voltage with negative temperature coefficient, which is complementary to absolute temperature (CTAT). In conventional BVR design, the CTAT voltage may be generated using a forward biased p-n junction having a temperature coefficient of −2 mV/° C. at room temperature. The PTAT voltage may be generated from a voltage difference of similar p-n junctions ratioed by N. When a p-n junction is in forward bias, its current can be expressed as:

$$I_D = I_S e^{qV_A/kT} \tag{EQ. 1}$$

where k is the Boltzmann constant, q is the electron charge and T is the temperature, and $V_A$ is a voltage across the p-n junction. In some embodiments, a diode-connected metal-oxide-semiconductor field-effect transistor (MOSFET) may be used in place of the p-n junction and the $V_A$ term from equation (1) may be $V_{GS}$, a gate-source voltage of the diode-connected MOSFET. $I_S$ is a constant called saturation current. Therefore, $$I_{PTAT} = \frac{\Delta V_A}{R_1} = \frac{kT\ln(N)}{qR_1} \tag{EQ. 2}$$

which is proportional to absolute temperature. By developing the $I_{PTAT}$ over a resistor $R_1$ with a correctly chosen value and summing PTAT and CTAT together, a reference voltage insensitive to temperature may be generated. In standard BVR circuits, the output voltage may be around 1.25 V. However, these standard BVR circuits will not work at supply voltages of 1.25 V or below. Typical FinFET supply voltages may be around 0.75 V. Thus, low voltage BVR circuits may be needed to provide reference voltages in FinFET contexts or for use with other low voltage technologies.

Additionally, standard BVR circuits may not allow for independent control of voltage offset and temperature slope of the reference voltage. Independent control of voltage offset and temperature slope is useful for adjusting the voltage offset and temperature slope that may vary as a result of process variations during fabrication.

Figure 1:
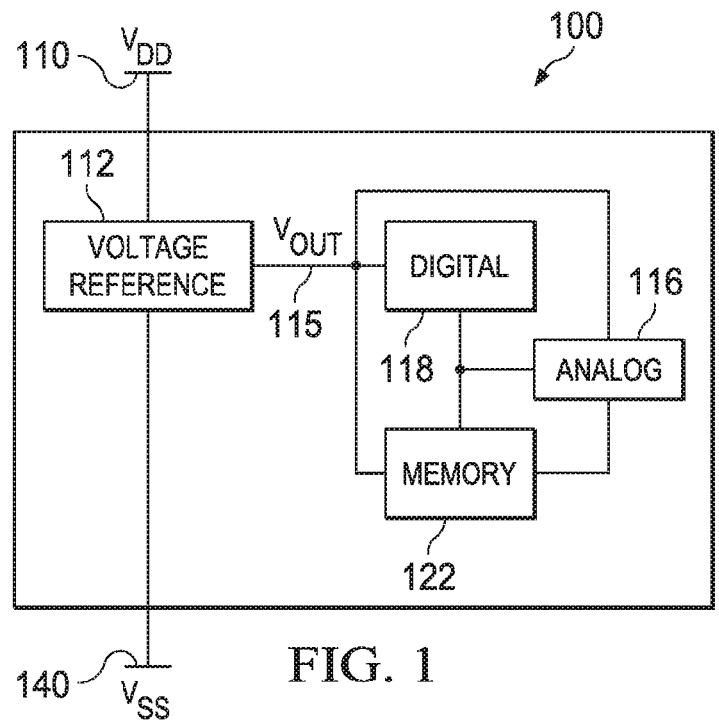
FIG. 1 depicts an exemplary System-On-Chip (SOC) circuit block diagram incorporating a voltage reference circuit, according to an illustrative implementation.

FIG. 1 depicts an exemplary SOC circuit block diagram, including a voltage reference circuit, according to an illustrative implementation. The SOC 100 is shown as an example of the incorporation of the voltage reference circuit 112 into a larger system. The positive supply voltage 110 may power the voltage reference circuit 112. The negative supply voltage $V_{ss}$ is shown at 140. The voltage reference circuit 112 may produce an output voltage reference that is programmable and scales linearly with changes in temperature of the SOC 100, and where a voltage temperature slope change and voltage offset are separately programmable with orthogonal voltage trimming. The output of the voltage reference circuit 112, $V_{out}$ 115, may be a low voltage, such that $V_{out}$<1 V. $V_{out}$ 115 may be the core voltage for 10 nm FinFET technology, which is typically 0.75 V. The output voltage reference may then be coupled to an Analog circuit block 116, a Memory block 122, and/or a Digital block 118, or any combination thereof. The Analog circuit block 116 and Digital circuit block 118 may be in communication with each other, as shown in FIG. 1. As referred to herein, the term "coupled to" may be understood to refer to directly or indirectly connected to (e.g., through an electrical connection).

The Memory block shown at 122 may be a Dynamic random-access memory (DRAM) block, a Static random-access memory (SRAM) block, a Thyristor random-access memory (T-RAM) block, any other suitable data storage circuit block, or any combination thereof. The T-RAM memory cell exploits the Negative Differential Resistance (NDR) behavior of a pnpn thyristor, and may provide high density memory storage. The voltage reference circuit 112 may provide a temperature-independent voltage reference or controllable temperature-dependent voltage reference to each of the blocks shown in SOC 100. The Analog circuit block 116 may amplify the voltage reference circuit 112's signal before sending it to the Digital circuit block 118. For each of the blocks 116, 118, and 122 shown in the SOC, the Voltage Reference circuit 112 may provide a temperature-independent voltage signal or controllable temperature-dependent voltage signal that may be converted or altered as needed by each of the circuit blocks.

Figure 2:
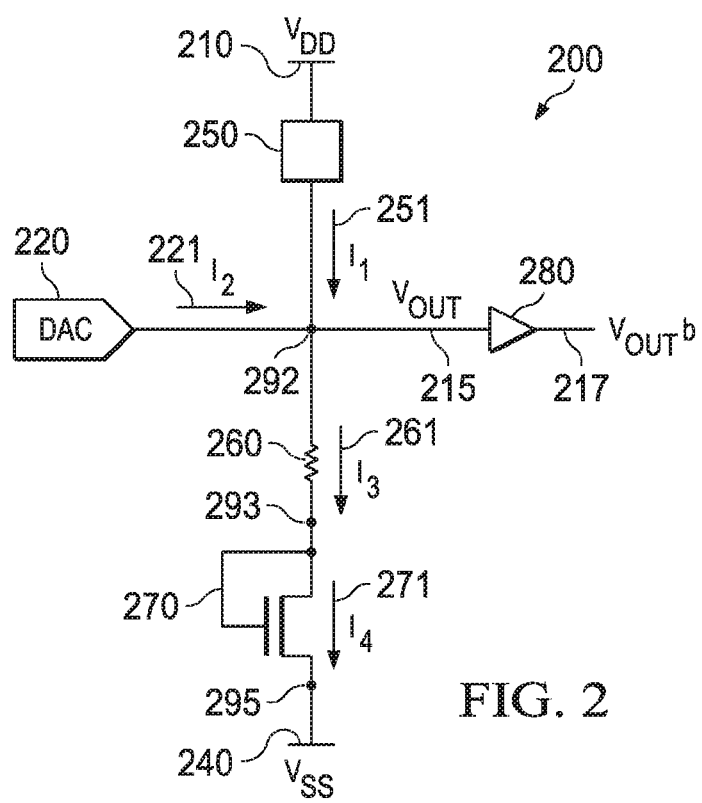
FIG. 2 depicts a typical BVR circuit, according to an illustrative implementation.

FIG. 2 depicts a typical BVR circuit, according to an illustrative implementation. The circuit shown at 200 has a positive supply voltage $V_{DD}$ 210. PTAT Current Generator Block 250 generates a temperature-dependent current $I_1$ 251. PTAT Current Generator Block 250 may be composed of Field-Effect-Transistors (FETs), or may be any circuit capable of producing a temperature-dependent current. The PTAT Current Generator Block 250 may be programmable, such that its output is temperature-dependent current $I_1$ 251, which may be increased or decreased in magnitude. PTAT current generator blocks are described in P. Gray and R. Meyer, "Analysis and Design of Analog Integrated Circuits", John Wiley & Sons, 1993, which is hereby incorporated by reference herein in its entirety. Digital to Analog Converter (DAC) 220 may be any N-bit programmable DAC. The DAC 220 may have a flat temperature slope, and thus DAC 220 may produce a temperature-independent current $I_2$ 221. The DAC 220 may be a Temperature Compensated DAC (TC DAC). TC DACs are described in P. R. Gray and R. Meyer, "Analysis and Design of Analog Integrated Circuits," 3rd edition, New York: Wiley, 1993, which is hereby incorporated by reference herein in its entirety. The magnitude of current $I_2$ 221 may be controlled by the input control bits (not shown) directed to the DAC 220. Kirchhoff's current law gives the current equation at node 292:

$$I_1 + I_2 = I_3 \quad (EQ. 3)$$

where $I_1$ 251 is a programmable temperature-dependent current, $I_2$ 221 is a programmable temperature-independent current, and $I_3$ 261 is their sum or superposition. Thus current $I_3$ 261 contains both a temperature-dependent ($I_1$ 251) and temperature-independent ($I_2$ 221) component. Current $I_3$ then generates a voltage across a PTAT device 260 (e.g., a resistor) between nodes 292 and 293 given by:

$$V_{260} = R(I_1 + I_2) \quad (EQ. 4)$$

where the voltage component $RI_1$ may be dependent on changes in temperature, producing part of the voltage slope of the output voltages $V_{out}$ 215 and $V_{outb}$ 217, and the voltage component $RI_2$ may be a temperature-independent voltage offset of the output voltages $V_{out}$ 215 and $V_{outb}$ 217. In some embodiments, PTAT device 260 may be a resistor. A resistance value of the PTAT device 260 (e.g., a resistor) may be chosen to have a desired temperature coefficient, and thus provide a desired PTAT voltage slope and offset to the output voltages \T$_{out}$ 215 and $V_{outb}$ 217 in response to changes in temperature. In some embodiments, a PTAT device may be chosen to have a zero temperature coefficient. In some embodiments, a PTAT device may be chosen to have a non-zero temperature coefficient.

The current $I_3$ 261 may then be directed to a Metal-Oxide-Semiconductor (MOS) device 270, which may be a NMOS, PMOS, CMOS, any other MOS transistor or any combination thereof. MOS device 270 may operate within a subthreshold region of its component MOSFETs. By utilizing the exponential characteristics of the MOS device 270 operating in its subthreshold region, substantially linear negative temperature characteristics of around −2 mV/° C. may be achieved similar to those of bipolar base-emitter junction characteristics (e.g., of a bipolar junction transistor (BJT)). However, BJTs may not be suitable for low voltage applications due to a minimum achievable reference voltage. In some embodiments, MOS device 270 may be a diode-connected NMOSFET. The voltage generated across a drain-source of a MOS device 270 (e.g., a diode-connected NMOSFET) between node 293 and node 295 may be a Complementary-To-Absolute-Temperature (CTAT) voltage, meaning that it may scale negatively to changes in temperature. The CTAT voltage generated at MOS device 270 may be a constant slope CTAT voltage, meaning that its slope may not be changed. The slope of the CTAT voltage may depend on the design of the MOS device 270 (e.g., sizes and/or doping profiles of a source, drain and/or channel of a component MOSFET). Negative supply voltage $V_{SS}$ is shown at 240.

The output voltage $V_{out}$ 215 may thus be a combination of the PTAT voltage across the PTAT Device 260 (which may scale positively with temperature), the temperature-independent offset across the PTAT Device 260, and the CTAT voltage from the MOS device 270. Buffer 280 may buffer the output voltage $V_{out}$ 215, and produce the buffered output voltage $V_{outb}$ 217. In some embodiments, there is no static current across Buffer 280 from a node at $V_{out}$ 215 to a node at $V_{outb}$ 217. In some embodiments, Buffer 280 may not be included at a node at $V_{out}$ 215.

Ideally, one would like to orthogonally trim the temperature slope and voltage offset of the output voltages $V_{out}$ 215 and $V_{outb}$ 217 by trimming bits to the N-bit DAC 220 and adjusting its output current $I_2$ 221, and adjusting the temperature-dependent current $I_1$251. Orthogonal trimming may be understood to refer to changing a voltage offset of output voltage $V_{out}$ 215 and/or $V_{outb}$ 217 without changing a temperature slope of the output voltage $V_{out}$ 215 and/or $V_{outb}$ 217. However, in the BVR circuit shown at 200, changes to $I_2$ 221 or $I_1$251 may affect both the temperature slope and voltage offset, since the currents $I_1$ and $I_2$ flow both across the PTAT device 260 and also into the MOS device 270. Even if the temperature coefficient of the DAC 220 is set to be substantially equal to 0, the flow of its output current $I_2$ 221 into the MOS device 270 with CTAT voltage characteristics may change a temperature coefficient of the MOS device 270 such that a temperature slope of the MOS device 270 may no longer be fixed. This means that the CTAT voltage, PTAT voltage and voltage offset may be interdependent on the output of the DAC 220 and PTAT Current Generator 250, such that one cannot change any of these values independently of each other.

Figure 3:
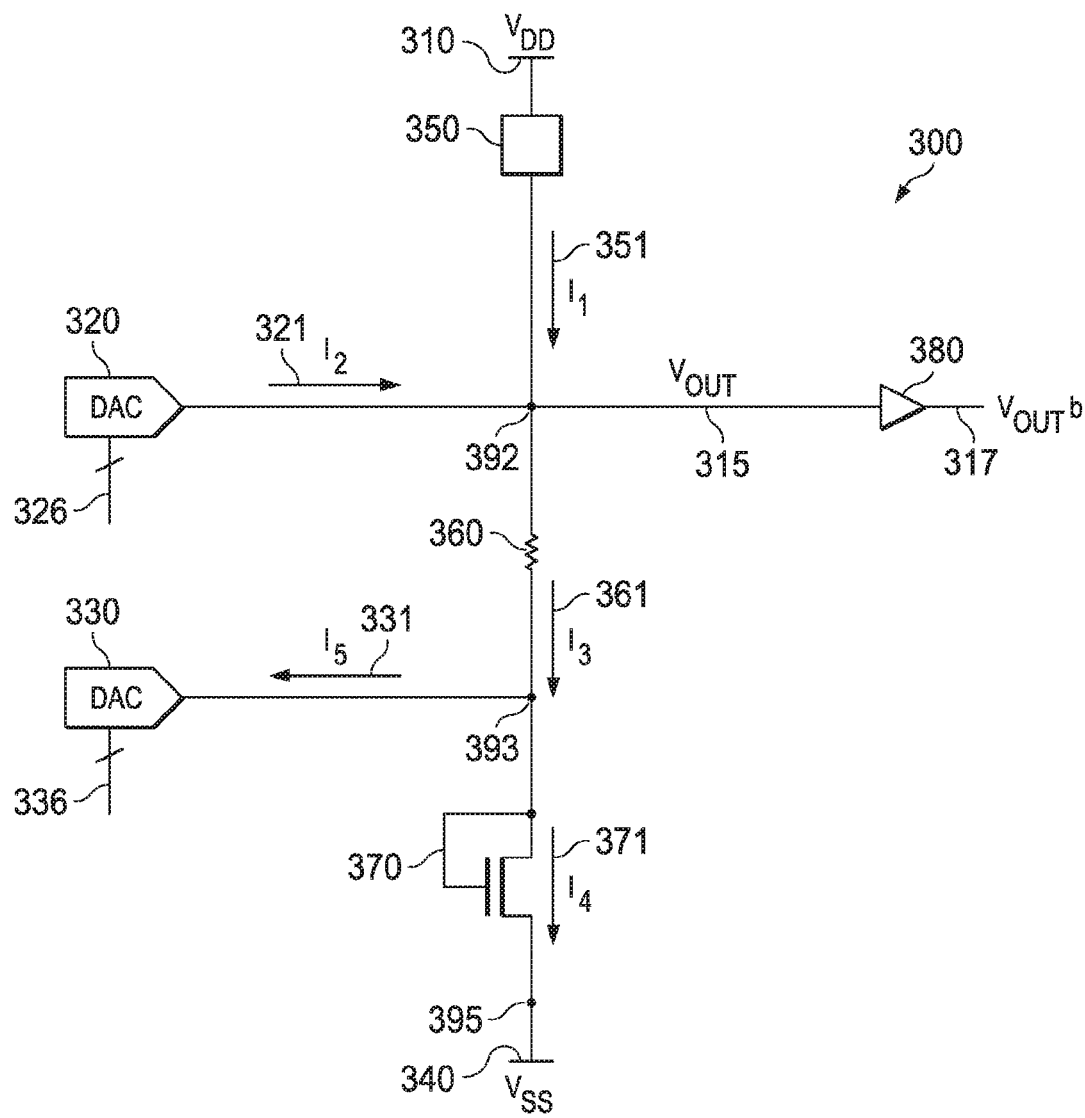
FIG. 3 depicts a low voltage BVR circuit with orthogonal output voltage trimming, according to an illustrative implementation.

FIG. 3 depicts a low voltage BVR circuit with orthogonal output voltage trimming, according to an illustrative implementation. The BVR circuit 300 allows for orthogonally trimming an offset of output voltage $V_{out}$ 315 and/or buffered output voltage \T$_{out}$ 317. The DAC 320 may be an N-bit programmable TC DAC, and may thus may have a flat temperature slope and produce a temperature-independent current $I_2$ 321. TC DACs are in P. Gray and R. Meyer, "Analysis and Design of Analog Integrated Circuits", John Wiley & Sons, 1993, which is hereby incorporated by reference herein in its entirety. The magnitude of temperature-independent current $I_2$ 321 may be adjusted by the digital input 326, which may provide N control bits. Similarly, the DAC 330 may be an N-bit programmable TC DAC, and may have a flat temperature slope and may be adjustable by the digital input 336.

The positive supply voltage $V_{DD}$ 310 may power the PTAT Current Generator Block 350. PTAT Current Generator Block 350 may generate a temperature-dependent current $I_1$ 351. PTAT Current Generator Block 350 may be composed of Field-Effect-Transistors (FETs), or may be any circuit capable of producing a temperature-dependent current. The PTAT Current Generator Block 350 may be programmable, such that its output temperature-dependent current $I_1$ 351 may be adjustable.

Kirchhoff's current law gives the current equation at node 392:

$$I_1 + I_2 = I_3 \quad (\text{EQ. 5})$$

where $I_1$ 351 is a programmable temperature-dependent current, $I_2$ 321 is a programmable temperature-independent current, and $I_3$ 361 is their sum. Thus current $I_3$ 361 contains both a temperature-dependent ($I_1$ 351) and temperature-independent ($I_2$ 321) component. Current $I_3$ 361 may generate a voltage across PTAT device 360 between nodes 392 and 393 given by:

$$V_{360} = R(I_1 + I_2) \quad (\text{EQ. 6})$$

where the voltage component $RI_1$ may be dependent on changes in temperature, producing part of the voltage slope of the output voltage $V_{out}$ 315 and/or $V_{outb}$ 317, and whereas $RI_2$ gives the temperature-independent voltage offset of the output voltages $V_{out}$ 315 and $V_{outb}$ 317. The resistance value of the PTAT device 360 may be chosen to have a desired temperature coefficient, and thus give the desired PTAT voltage slope and offset to the output voltage $V_{out}$ 315 and/or $V_{outb}$ 317 in response to changes in temperature.

Current $I_3$ 361 may then be divided at node 393 into two components: $I_5$ 331 and $I_4$ 371. DAC 330 may act as a current sink, and may be programmed at digital input 336 such that $I_5$ 331 may be substantially equal to $I_2$ 321 in magnitude. $I_5$ 331 may have the opposite polarity and/or direction of $I_2$ 321. In some embodiments, $I_5$ may be within 1% of $I_2$. If the DAC 320 and DAC 330 have a substantially zero temperature coefficient, and produce currents of substantially equal magnitude, the orthogonality between the adjustment of the temperature slope and the voltage offset may be maintained. If DAC 320 and/or DAC 330 has a substantially non-zero temperature coefficient, and produce currents of magnitude that deviate from substantially equal, there may be deviation from orthogonality between the adjustment of the temperature slope and the voltage offset. In some embodiments, $I_5$ may be within 5% of $I_2$. Since $I_5$ may be substantially equal to $I_4$, this means that the current output $I_1$ 351 of the PTAT Current Generator Block 350 may be substantially equal to $I_4$ 371 in magnitude. In some embodiments, $I_4$ may be within 1% of $I_1$. In some embodiments, $I_4$ may be within 5% of $I_1$.

Current $I_4$ may then supply MOS device 370, which may be a NMOS, PMOS, CMOS, any other MOS transistor, or any combination thereof. MOS device 370 may operate within a subthreshold region of its component MOSFETs. By utilizing the characteristics of the MOS transistor 370 operating in its subthreshold region, substantially linear negative temperature characteristics of around −2 mV/° C. can be achieved similar to those of bipolar base-emitter junction characteristics (e.g., of a BJT). However, BJTs may not be suitable for low voltage applications due to a minimum achievable reference voltage. In some embodiments, MOS device 370 may be a diode-connected NMOSFET. The voltage generated across a drain-source of a MOS device 370 (e.g., a diode-connected MOSFET) between node 393 and node 395 may be a CTAT voltage, meaning that it may scale negatively to changes in temperature. The CTAT voltage generated at MOS device 370 may be a constant slope CTAT voltage, meaning that its slope may not be changed. The slope of the CTAT voltage may depend on the design of the MOS device 370 (e.g., sizes and/or doping profiles of a source, drain and/or channel of a component MOSFET). Negative supply voltage $V_{SS}$ is shown at 340.

The output voltage $V_{out}$ 315 may thus be a combination of the PTAT voltage across the PTAT device 360 (which scales positively with temperature), the temperature-independent offset across the PTAT device 360, and the CTAT voltage from the MOS device 370. Buffer 380 may buffer the output voltage $V_{out}$ 315, and produce the buffered output voltage $V_{out}$ 317. In some embodiments, there is no static current across Buffer 380 from a node at $V_{out}$ 315 to a node at $V_{outb}$ 317. In some embodiments, Buffer 380 may not be included at a node at $V_{out}$ 315.

BVR circuit 300 may allow for orthogonal trimming of the output voltage $V_{out}$ 315 and/or $V_{outb}$ 317 by ensuring that changes to $I_1$ 351 affect the PTAT voltage generated across the PTAT device 360, whereas changes to $I_2$ 321 affect the temperature-independent voltage offset generated across the PTAT device 360. This may be achieved through a two-step trimming process. For example, if one were to adjust (e.g, increase or decrease) both the temperature slope and temperature offset of the output voltage $V_{out}$ 315 and/or $V_{outb}$ 317, one would first flow a temperature-dependent current from PTAT Current Generator Block 350, through the PTAT device 360, into the MOS device 370 and to the negative supply voltage $V_{ss}$ 340. If $I_1$ 351 (e.g., output by PTAT Current Generator Block 350) is increased (e.g., by adjusting inputs to PTAT Current Generator Block 350), then the PTAT component of $I_3$ may also be increased, and the PTAT voltage generated across PTAT device 360 may thus also increase. The current $I_4$ 371 may be substantially equal to the increased $I_1$ 351. For example, the current $I_4$ 371 may be within 1% of the increased $I_1$ 351. For example, the current $I_4$ 371 may be within 5% of the increased $I_1$ 351. Because the CTAT contribution of the MOS device 370 may not substantially depend on the magnitude of $I_4$ 371, and the CTAT voltage contribution to the output voltages $V_{out}$ 315 and/or $V_{out}$ 317 may not change. Increasing $I_1$ may also not affect the voltage offset generated at the PTAT device 360 by temperature independent current $I_2$ 321, since the temperature-independent current $I_2$ 321 which produces the voltage offset flows from DAC 320 to DAC 330. Accordingly, the temperature independent voltage offset (e.g., generated from temperature-independent current $I_2$ 321) may thus be independent of the PTAT current $I_1$ flowing from PTAT Current Generator Block 350 to the MOS device 370.

A second step, for example, to adjust (e.g., increase or decrease) the voltage offset of output voltage $V_{out}$ 315 and/or $V_{outb}$ 317 may be to change the input control bits at digital input 326 to DAC 320, and or the input control bits at digital input 336 to DAC 330. The temperature-independent current $I_2$ 321 may then be increased, and flow through the PTAT device 360. The temperature-independent current $I_2$ 321 may thus generate a temperature-independent voltage offset across PTAT device 360. The temperature-independent current may then flow from PTAT device 360 in opposite polarity and/or direction and with substantially equal magnitude as current $I_5$ 331 to DAC 330. Thus, the temperature-independent current may not flow from the PTAT device 360 to the MOS device 370, ensuring that the voltage offset produced across nodes 392 and 393 remains temperature-independent.

In some embodiments, the positions of PTAT Current Generator Block 350, PTAT device 360 and/or MOS device 370 may be interchanged. In some embodiments, the positions of DAC 320 and DAC 330 may be interchanged at other nodal positions.

The output voltages of the BVR circuit 300 $V_{out}$ 315 and/or $V_{out}$ 317 may be low voltages, such that $V_{out}$ 315<1 V and/or $V_{outb}$ 317<1 V. The output voltages $V_{out}$ 315 and/or $V_{outb}$ 317 may be the core voltages for standard FinFET technology. The output voltages $V_{out}$ 315 and/or $V_{outb}$ 317 may each be <0.75 V.

This description has been presented for the purposes of illustration. It is not intended to be exhaustive or to limit the invention to the precise form described, and many modifications and variations are possible in light of the teaching above. For example, PMOS devices may be used in place of NMOS devices, and NMOS devices may be used in place of PMOS devices in suitable configurations. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An apparatus for independently adjusting voltage offset and voltage temperature slope of a voltage reference circuit comprising:
   a PTAT device with a first terminal and a second terminal;
   a first DAC connected to the first terminal and configured to output a first temperature-independent current;
   a second DAC connected to the second terminal and configured to output a second temperature-independent current of opposite direction to the first temperature-independent current;
   a PTAT current generator connected to the first terminal and configured to output a first temperature-dependent current; and
   a CTAT voltage device connected to the second terminal and configured to output a CTAT voltage.

2. The apparatus of claim 1, wherein the PTAT device is a resistor.

3. The apparatus of claim 2, wherein a magnitude of the first temperature-independent current is substantially the same as a magnitude of the second temperature-independent current.

4. The apparatus of claim 3, wherein the CTAT voltage device is a CTAT diode connected MOSFET.

5. The apparatus of claim 4, wherein the CTAT voltage device operates within a subthreshold region.

6. The apparatus of claim 5, further comprising a first programmable digital input to the first DAC, and a second programmable digital input to the second DAC.

7. The apparatus of claim 6, wherein the first temperature-dependent current is separately programmable from the first programmable digital input and the second programmable digital input.

8. The apparatus of claim 7, further comprising a buffer connected to the first terminal and configured to output a reference voltage.

9. The apparatus of claim 8, wherein the reference voltage is less than one volt.

10. The apparatus of claim 8, wherein the reference voltage has an adjustable voltage offset and an adjust voltage temperature slope, and a change in the adjustable voltage offset is independent of a change in the adjustable voltage temperature slope.

* * * * *